United States Patent [19]

Cheever

[11] Patent Number: 4,496,881

[45] Date of Patent: Jan. 29, 1985

[54] METHOD OF COLD CATHODE REPLENISHMENT IN ELECTRON BEAM APPARATUS AND REPLENISHABLE COLD CATHODE ASSEMBLY

[75] Inventor: Richard N. Cheever, Acton, Mass.

[73] Assignee: Tetra Pak Developpement SA, Lausanne, Switzerland

[21] Appl. No.: 427,862

[22] Filed: Sep. 29, 1982

[51] Int. Cl.$^3$ ........................ H01J 37/067; H01J 1/30

[52] U.S. Cl. .................................. 315/357; 313/146; 313/147; 314/37

[58] Field of Search ................ 315/357; 313/146, 147; 314/37, 60, 135

[56] References Cited

U.S. PATENT DOCUMENTS

| | | | |
|---|---|---|---|
| 2,122,829 | 7/1938 | Wildenthaler | 313/146 |
| 2,133,407 | 10/1938 | Stone | 313/146 |
| 4,052,633 | 10/1977 | Schoenmakers | 313/146 |
| 4,305,000 | 12/1981 | Cheever | 250/492.3 |
| 4,340,845 | 7/1982 | Hildebrand et al. | 315/357 X |
| 4,388,560 | 6/1983 | Robinson et al. | 315/357 X |

*Primary Examiner*—David K. Moore
*Assistant Examiner*—Vincent DeLuca
*Attorney, Agent, or Firm*—Rines and Rines, Shapiro and Shapiro

[57] ABSTRACT

This disclosure is concerned with automatically replenishable cold cathode structures and the like wherein the monitoring of a predetermined variation in electron beam performance caused by erosion of the cathode material generates control signals for advancing reserve cathode material into operative position.

7 Claims, 7 Drawing Figures

METHOD OF COLD CATHODE REPLENISHMENT IN ELECTRON BEAM APPARATUS AND REPLENISHABLE COLD CATHODE ASSEMBLY

The present invention relates to electron beam generator apparatus, being more particularly concerned with electron beam apparatus of the cold cathode type.

In my earlier U.S. Pat. No. 4,305,000 there is disclosed a novel cold cathode electron beam generator and control circuit particularly adapted for such purposes as the relatively low energy electron-beam sterilization of surfaces and articles. This type of apparatus is also applicable for other electron-beam irradiation purposes and, while successful in technical operation, has been found to require relatively frequent replacement of the cold cathode structure as a result of its erosion during cold cathode electron beam pulsed or other operation for sterilization or related purposes, as before mentioned. While in some applications there is no problem in shutting down the apparatus, reducing the vacuum in the evacuated housing and removing the cathode assembly and replacing the same, there are instances in production-line operation, such as in the sterilization of paper or other sheet or web surfaces (as for sterilized food packages and the like) where it is desirable to attain much longer life of the cathode.

It is particularly to this principal objective that the present invention is primarily directed, it being an object of the invention to provide a new and improved method of cold cathode replenishment in an electron beam generator and the like and an improved replenishable cold cathode assembly structure of novel construction and operation. Through this objective, the invention enables the automatic incremental replenishment of the cold cathode over a relatively long period of time, reducing the number of shut downs and disassembly operations required in continual production line usage.

A further object is to provide a novel electron beam cathode assembly and method of operation of more general utility, as well.

Other and further objects will be explained hereinafter and are more particularly delineated in the appended claims.

In summary, however, from one of its important aspects, the invention broadly embraces a method of maintaining the constancy of electron beam performance of a cold cathode electron beam generator as continual operation thereof erodes the surface of the cathode facing the anode of the generator within its evacuated housing, that comprises, providing a reserve cathode structure extending behind said surface within the evacuated housing and away from the anode; monitoring electron beam performance characteristics; upon the monitoring of a predetermined variation in said characteristics resulting from cathode surface erosion and the like over successive intervals of time, producing control signals; and causing said control signals thereupon to advance reserve cathode a predetermined increment in the direction toward the anode at such successive intervals of time to compensate for the successive erosion of the cathode surface facing the anode and the resulting beam performance variations. Preferred replenishable cold cathode assembly constructions and other details are hereinafter presented including best mode embodiments.

The invention will be described in connection with the accompanying drawing,

FIG. 1 of which is a longitudinal cross section of a cathode construction embodying the invention and practicing the method thereof in preferred form;

Figure 1:
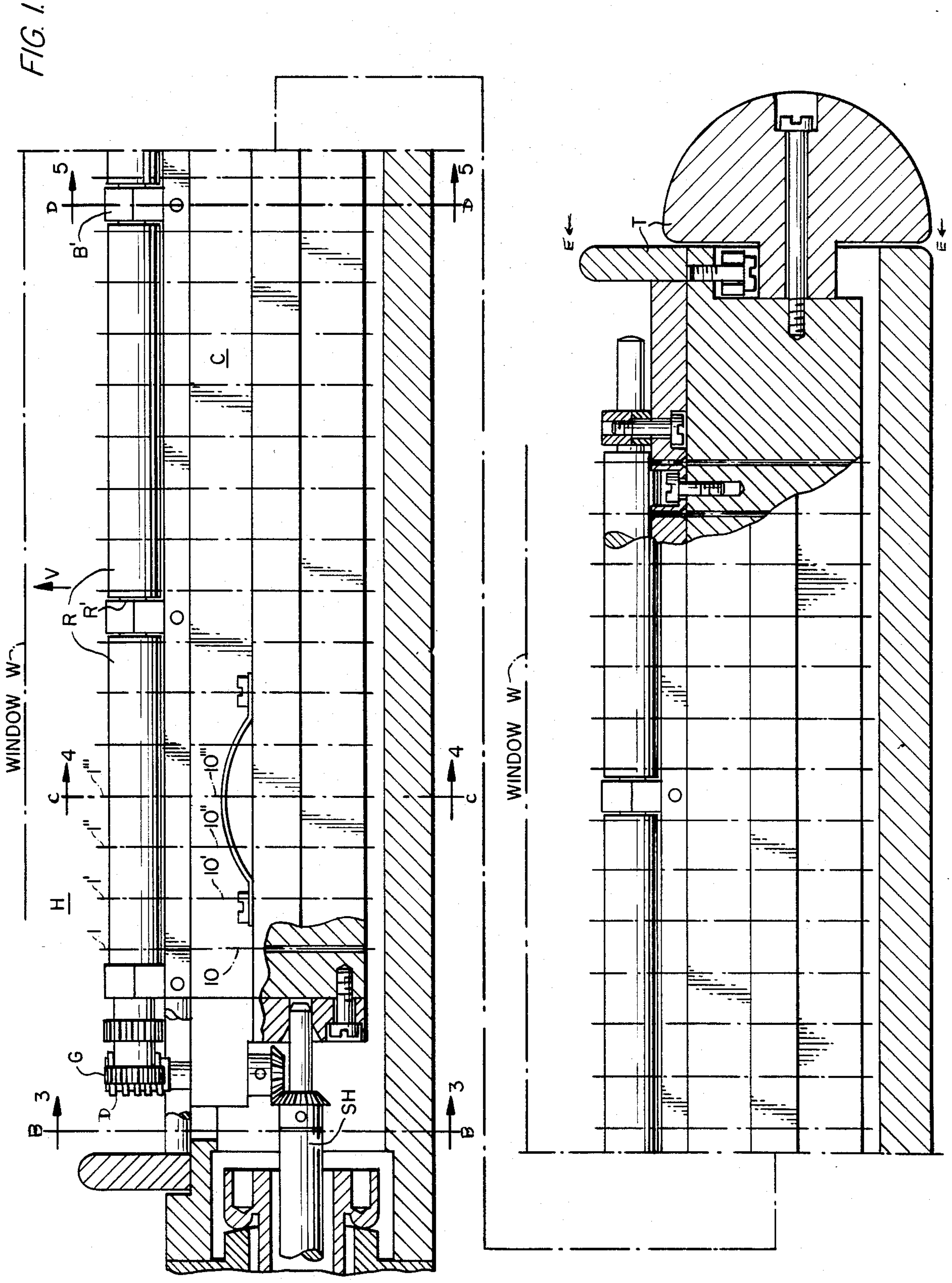
Figure 2:
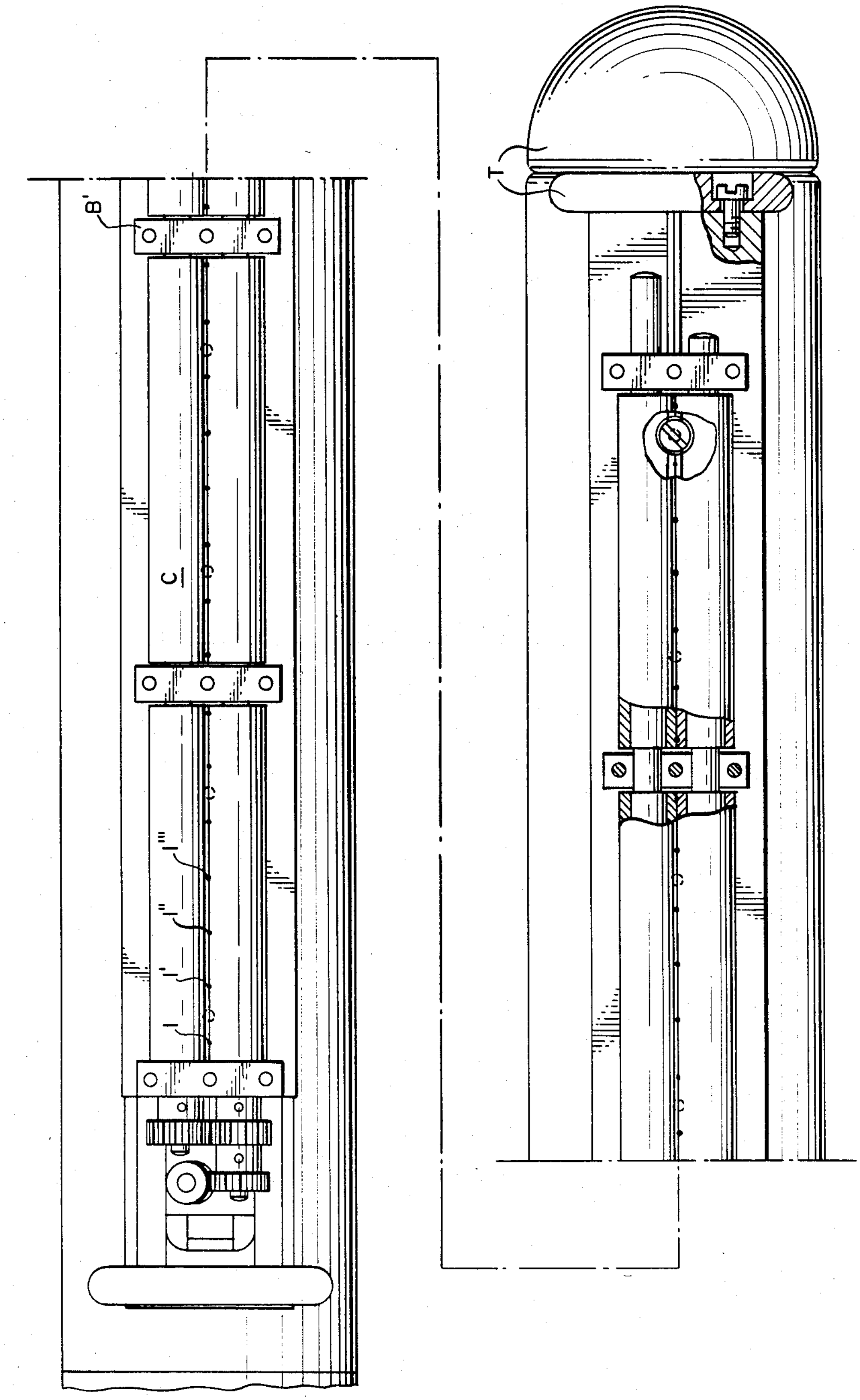
FIG. 2 is a top elevational view of the same.
Figure 4:
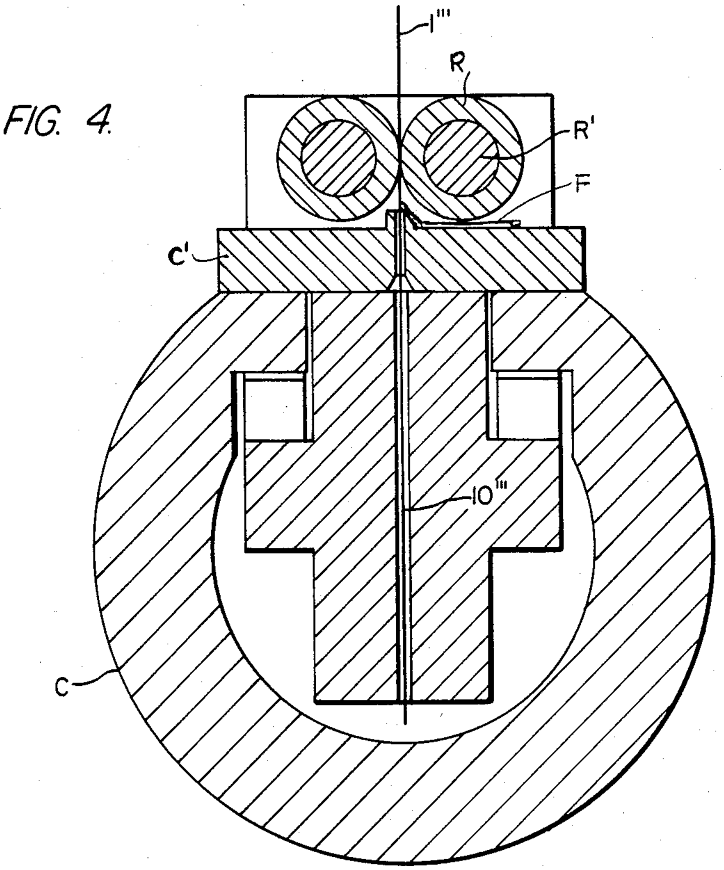
FIGS. 4, 5 and 6 are similar transverse sectional views taken along the respective lines CC, DD and EE looking in the direction of the arrows indicated in FIG. 1.
Figure 7:
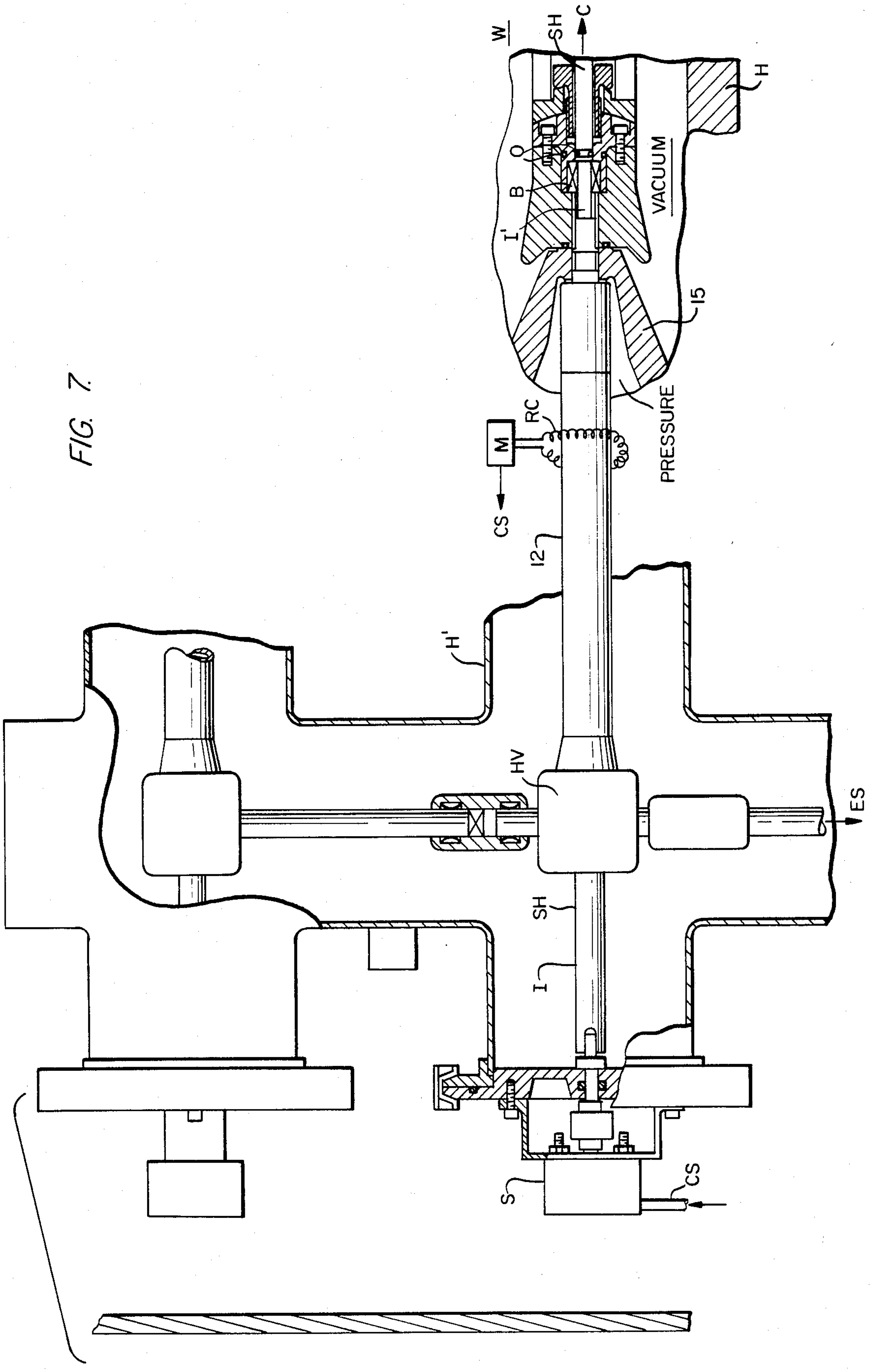
FIG. 7 is a longitudinal section of part of the complete apparatus in which the cathode structure of FIGS. 1 and 2 may be embodied.

Referring to FIG. 1, the cathode C of the electron beam generator of the type described in said Letters Patent, for example, is shown comprising a plurality of successively longitudinally substantially equally spaced cold cathode material rods 1, 1', 1'', 1''', etc., extending transversely upward in a direction V toward the window anode W of the evacuated housing, designated schematically at H and constituting the envelope of the electron beam generator, as described in said Letters Patent. In the more detailed section shown in FIG. 4, the exemplary cathode 1''' is illustrated extending upwardly beyond a pair of elastomeric rollers R, such as silicone rubber or the like, covering shafts R' which, as shown in FIG. 1, extend longitudinally along the housing parallel to the window W. In FIG. 7, the vacuum housing H, window location W, and longitudinally extending cathode assembly structure C are shown schematically to the right, receiving current along a hollow conductor 12 from a high voltage terminal HV disposed in a pressurized housing section H', sealed from the evacuated housing H containing the cathode and window anode assembly C-W by a tapered bushing 15. The terminal HV receives voltage from appropriate energy supply circuits ES, as described in said Letters Patent and not shown since they do not involve any part of the present invention, and since the improved cathode assembly structure of the present invention may be operated with other types of energizing circuits as well. The system of FIG. 7 can accommodate a plurality of electron-beam irradiators, as for treating opposite sides of a material.

Figure 3:
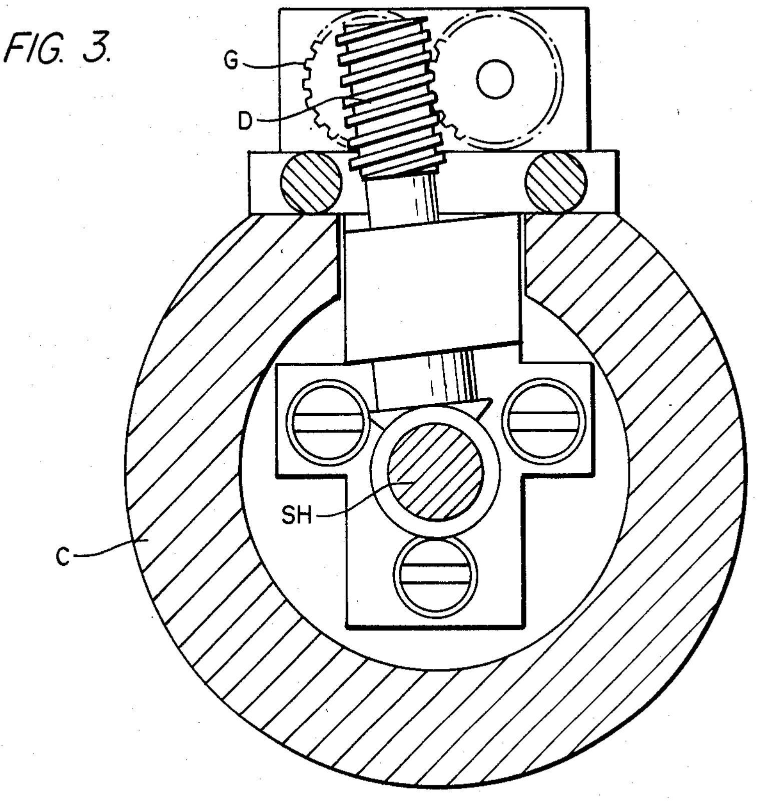
FIG. 3 is a transverse section taken along the line BB of FIG. 1 looking in the direction of the arrows.

A rotatable insulating rod I passes longitudinally through the terminal HV and within the hollow conductor 12, ultimately to rotate the shaft SH, FIGS. 1, 3 and 7. It is keyed to be driven by an external stepping motor or relay S and rotates within the hollow current-supply conductor 12, driving its right-hand extension I' within bearings B which are sealed from the vacuum in the cathode housing H by O-rings O. As more particularly shown by the detail of the worm D and wormgear G in FIGS. 1 and 3, the rotated shaft SH causes rotation of the rollers R-R' longitudinally parallel to the cathode assembly C.

Underlying the invention is the concept that, as the upper end surfaces of the cathode rods 1, 1', 1'', 1''', etc. erode during continual operation of the electron beam generator, the erosion will have become sufficiently serious after an interval of time to alter the performance characteristics or parameters of the electron beam (current and/or energy etc.) to a degree that is considered sufficiently degrading that the system should be provided with additional or replacement or replenished cathode in order to restore these performance characteristics to values within acceptable limits.

In accordance with the invention, this is accomplished by providing behind the protruding cathode portions 1, 1', 1'', 1''', etc. that face the anode window W, rearward or downwardly extending extensions (in FIG. 1) that in effect constitute replenishing cathode material or rods or rod extensions. This is more particularly shown in FIG. 4, for example, where the upwardly protruding cathode portion 1''' is shown maintained or disposed or held between the rollers R and has a downward extension labelled 10''' which serves as a reserve supply of cathode, in effect, which can be brought to operative condition as the upwardly vertically extending cathode portion 1''' erodes away, replacing the same through the rotational advancing action of the rollers R. Resilient conducting fingers F, FIG. 4, insure contact of the cathode rods with the base C' in electrical contact with the body of the cathode structure C. The other cathode rods 1, 1', 1'', etc. are similarly shown backed by respective extensions 10, 10', 10'', etc. which serve as reserve cathode which can be advanced, as needed, as the upwardly protruding surfaces of the cathode exposed to and facing the window W become eroded away during the continual operation of the same. In this manner, the cathode does not have to be replaced for considerable periods of time, improving the production line usefulness of the apparatus.

The monitoring apparatus M, FIG. 7, for detecting the electron beam current (or applied voltage or other parameter) may assume the form of, for example, a so-called Rogowski-coil RC that picks up current fed along the conductor 12 and into the cathode C from the energy storage circuits ES, such current being affected by deteriorating cathode performance. The monitor M thus senses when an incremental loss of performance has occurred and will feed back a signal by the lead CS to control the stepping motor S at such time in order to cause the incremental rotation of the insulator I. Through this mechanism the incremental rotation of the shaft SH and thus the rollers R will occur, advancing the cathodes out toward the window anode W an incremental amount compensatory of the erosion that produced the degree of degradation monitored. Thus, at successive intervals of time when successive incremental erosions have occurred that are reflected in a certain threshold of deterioration of electron beam performance and thus supply current that has been monitored, replenished increments of cathode are provided to keep the cathode performance and electron beam performance parameters or characteristics substantially constant.

In FIG. 3 the tilting of the worm D is illustrated for engaging the worm-gear G that drives the rollers R, the driveshaft being indicated at SH in FIGS. 1, 3 and 7.

Figure 5:
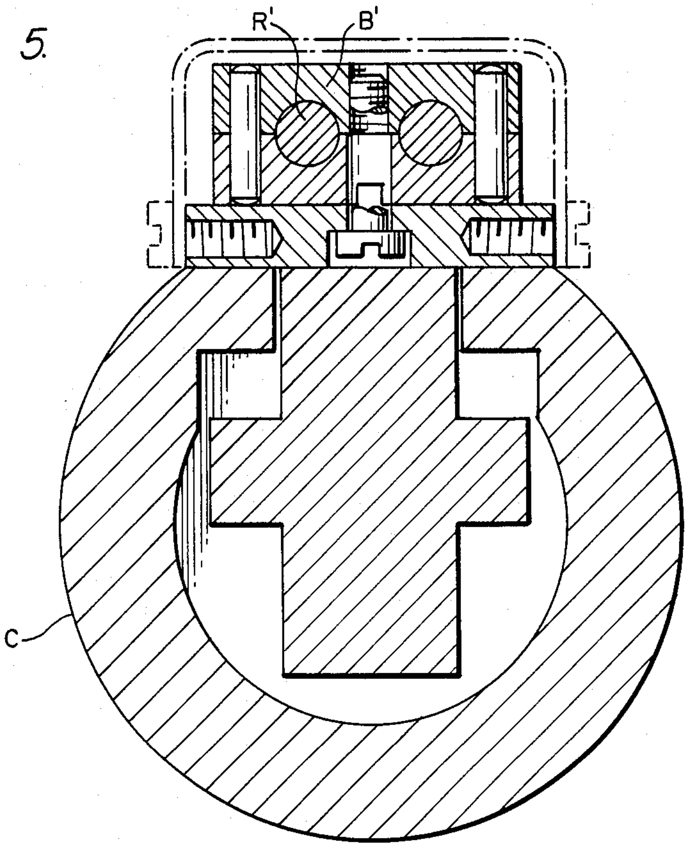
Figure 6:
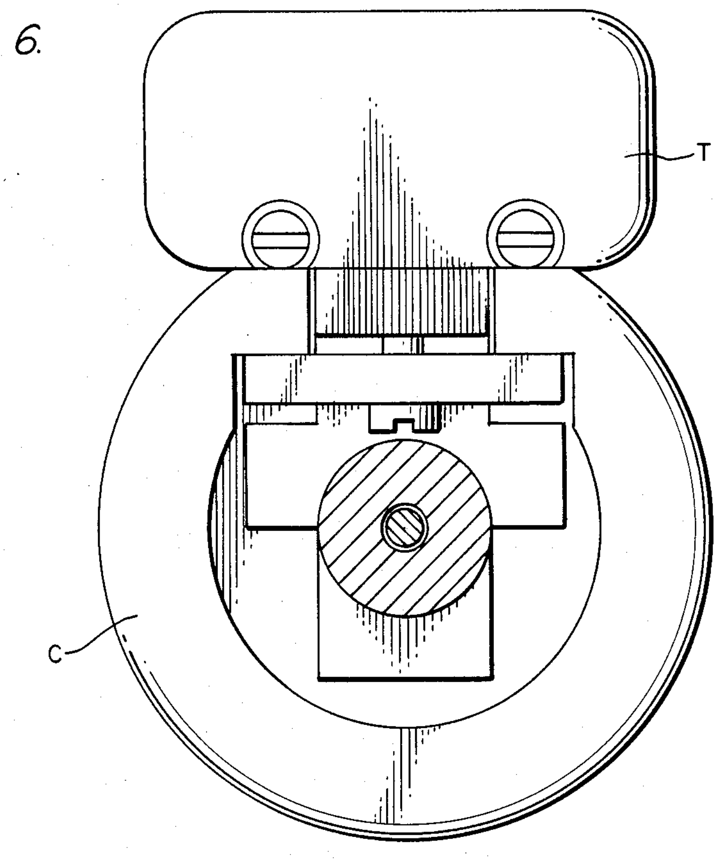

Turning to FIG. 5, the section along the line DD shows the bearing blocks B' in which the shafts R' of the rollers R rotate. This provides accurate alignment of the shafts R' along the length of the cathode structure C and provides compression and friction of the rubber or other rollers R, assuring the advancing of the cathode rods. Similarly, the section of FIG. 6 shows a stress-relieving terminal section T of the cathode assembly C.

While the drive at SH is shown effected from the left-hand pressure side of the apparatus, as more particularly indicated in FIG. 7, with the insulator I controlling the shaft SH driving from the pressure side, it is to be understood that, if desired, the drive may be from the opposite or vacuum side.

In actual practice, it has been determined for some applications, including the before-mentioned use in the sterilization of packaging products and the like, that a change of the order of 1% in electron beam parameters would indicate undesired degree of erosion of the cathode—about the order of 0.1 millimeter of erosion for a cathode rod. A suitable cathode rod material is graphite and the rod may have a diameter of about a quarter of a millimeter. At the incremental time that such a 1% change has occurred, the monitor M will produce a control signal that causes the rollers R simultaneously to advance the cathode rods 1, 1', 1'' etc. sufficiently (in this case 0.1 millimeter) to restore the electron beam operating characteristics to the desired parameters and thereby effect a substantial constancy of electron beam performance during use. The invention also provides for the uniform replenishment and advancement of the plurality of cathodes 1, 1', 1'' constituting the linear array of electron beam cathodes, at the same time giving uniformity of feed and accuracy which provides the uniform linear operation of the beam throughout its transverse extent. The beam is thus monitored continuously, and when the deterioration in current or voltage or other electron beam parameter indicates an increment of a 1% change, the control signal from the monitor then causes the 0.1 millimeter advancement of replenishment graphite or other cold cathode rod in the region facing the window W—simultaneously for all 30 cathode rods in the particular example illustrated, enabling the uniform results before described.

The dimensions and other details of this particular cathode illustrated in the drawings and its operating voltages are as follows. The cathodes may be spaced 1 cm. apart along a cathode assembly width of 50 cm. and the initial cathode rod lengths may be of the order of 50 millimeters, with a distance of 15 mm. from the window W. They may be driven from a 150 KV energy source, more or less, attaining a life time on the order of 500 hours.

While cathode rods are indicated, clearly other geometrical configurations may be used with replenishment cathode material therebehind. The term "rod" as herein employed is intended generically to embrace thin and thick cylinders or blocks and the like. Similarly, other advancing mechanisms than the illustrated rollers and particular type of gearing and drive will be readily recognized as useable, though the illustrated device has been found to provide excellent uniformity of replenishment and performance with simple construction. The mechanical system described has been designed to provide a uniformity of cathode rod feed, and hence a comparable current uniformity of the cathode structures, of the order of 1–2%, for example. Lack of feed uniformity results in undesirable current non-uniformity along the cathode. Clearly other types of electron-beam operation monitors may also be employed. The invention also has usefulness with other electron structures than the beam-irradiators of the preferred described use, and thus may be used with other types of anodes. Further modifications will also occur to those skilled in this art and such are considered to fall within the spirit and scope of the invention as defined in the appended claims.

What is claimed is:

1. Apparatus for generating an electron beam of elongated cross-section, said apparatus comprising an elongated evacuated housing having an elongated cathode structure extending longitudinally therein and elongated anode means extending longitudinally of said housing and spaced from said cathode structure, said apparatus being characterized in that said cathode structure has a plurality of substantially parallel cathode rods spaced along the length of said cathode structure with the length of the rods transverse to said cathode structure, said rods having means for advancing the same toward said anode means in response to a control signal to provide replacement of eroded cathode material, and in that said apparatus includes means for monitoring variations in electron beam performance and for producing said control signal, whereby the electron beam performance may be maintained substantially constant.

2. Apparatus in accordance with claim 1, wherein said cathode structure is of the cold-cathode type.

3. Apparatus in accordance with claim 1, wherein said anode means comprises an elongated electron permeable window.

4. Apparatus in accordance with claim 1, wherein said monitoring means comprises means for monitoring cathode current.

5. Apparatus in accordance with claim 1, wherein said advancing means comprises a pair of roller means between which said rods extend.

6. Apparatus in accordance with claim 5, wherein said cathode structure comprises an elongated cylinder from which said rods are advanced.

7. Apparatus in accordance with claim 6, wherein said roller means are disposed between said cylinder and said anode means.

* * * * *